United States Patent
Hussell et al.

(10) Patent No.: US 7,649,209 B2
(45) Date of Patent: Jan. 19, 2010

(54) SIDE-VIEW SURFACE MOUNT WHITE LED

(75) Inventors: Christopher P. Hussell, Cary, NC (US); Michael J. Bergmann, Chapel Hill, NC (US); Brian T. Collins, Raleigh, NC (US); David T. Emerson, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 11/739,307

(22) Filed: Apr. 24, 2007

(65) Prior Publication Data
US 2007/0262339 A1 Nov. 15, 2007

Related U.S. Application Data (60) Provisional application No. 60/745,478, filed on Apr. 24, 2006.

(51) Int. Cl.
*H01L 33/00* (2006.01)
(52) U.S. Cl. ............... 257/98; 257/99; 257/E33.061
(58) Field of Classification Search ............ 257/100, 257/81, 98, 99; 362/612; 345/82; 438/22, 438/26, 27, 29
See application file for complete search history.

(56) References Cited

U.S. PATENT DOCUMENTS

| | | | |
|---|---|---|---|
| 5,625,202 | A | 4/1997 | Chai |
| 5,959,316 | A | 9/1999 | Lowery |
| 5,998,925 | A | 12/1999 | Shimizu et al. |
| 6,155,699 | A | 12/2000 | Miller et al. |
| 6,432,745 | B1 | 8/2002 | Waitl et al. |
| 6,483,196 | B1 | 11/2002 | Wojnarowski et al. |
| 6,572,280 | B2 | 6/2003 | Hurt et al. |
| 6,614,179 | B1 | 9/2003 | Shimizu et al. |
| 6,642,652 | B2 | 11/2003 | Collins, III et al. |
| 6,733,189 | B2 | 5/2004 | Hurt et al. |
| 6,734,467 | B2 * | 5/2004 | Schlereth et al. ............. 257/89 |
| 6,936,862 | B1 | 8/2005 | Chang et al. |

(Continued)

OTHER PUBLICATIONS

International Search Report of foreign counterpart International Application PCT/US2007/008503 mailed Nov. 13, 2007, 5 pages.

(Continued)

*Primary Examiner*—Zandra Smith
*Assistant Examiner*—Paul E Patton
(74) *Attorney, Agent, or Firm*—Summa, Additon & Ashe, P.A.

(57) ABSTRACT

A light emitting diode is disclosed. The diode includes a package support and a semiconductor chip on the package support, with the chip including an active region that emits light in the visible portion of the spectrum. Metal contacts are in electrical communication with the chip on the package. A substantially transparent encapsulant covers the chip in the package. A phosphor in the encapsulant emits a frequency in the visible spectrum different from the frequency emitted by the chip and in response to the wavelength emitted by the chip. A display element is also disclosed that combines the light emitting diode and a planar display element. The combination includes a substantially planar display element with the light emitting diode positioned on the perimeter of the display element and with the package support directing the output of the diode substantially parallel to the plane of the display element.

20 Claims, 7 Drawing Sheets

U.S. PATENT DOCUMENTS

| | | |
|---|---|---|
| 7,091,653 B2 * | 8/2006 | Ouderkirk et al. ............ 313/113 |
| 7,126,274 B2 * | 10/2006 | Shimizu et al. ............. 313/512 |
| 7,157,746 B2 * | 1/2007 | Ota et al. .................... 257/100 |
| 2001/0001207 A1 | 5/2001 | Shimizu et al. |
| 2002/0063520 A1 | 5/2002 | Yu et al. |
| 2004/0140765 A1 * | 7/2004 | Takekuma ................. 313/512 |
| 2005/0205974 A1 | 9/2005 | Su et al. |
| 2005/0213320 A1 | 9/2005 | Kazuhiro et al. |
| 2005/0221519 A1 | 10/2005 | Leung et al. |
| 2005/0230691 A1 * | 10/2005 | Amiotti et al. ................ 257/79 |
| 2006/0038542 A1 | 2/2006 | Park et al. |
| 2006/0138937 A1 | 6/2006 | Ibbetson |
| 2007/0075629 A1 | 4/2007 | Le Toquin et al. |

OTHER PUBLICATIONS

Lighting Answers: LED Lighting Systems; vol. 7, Issue 3, Rensselaer Polytechnic Institute; May 28, 2003, pp. 23.

* cited by examiner

SIDE-VIEW SURFACE MOUNT WHITE LED

BACKGROUND

The present invention relates to light emitting diodes (LEDs) and in particular relates packaged LEDs that are used in side-view surface mount applications and that produce white light.

The basic physics of light emitting diodes is well understood in the art and explained in sources that include, but are not limited to Sze, *Physics of Semiconductor Devices*, 2d Edition (1981) and Sze, *Modern Semiconductor Device Physics* (1998). The practical applications of light emitting diodes are also well understood and are explained in helpful terms in a number of sources including *LED Lighting Systems*, NLPIP Lighting Answers, Volume 7, Issue 3, May 2003, and Schubert, *Light Emitting Diodes* (Cambridge University Press, 2003).

Side-view surface mount light emitting diodes (also referred to as "side-lookers" or "sidelookers") are LEDs that are packaged in a manner that transmits their radiation beam parallel to the plane of a circuit board or similar mount. In turn, sidelooker diodes that can produce white light are useful for incorporation into relatively small devices such as the color screen displays of cellular phones, personal digital assistants ("PDA's"), portable gaming devices, and similar applications.

Such applications often use liquid crystal displays ("LCDs"), polarizing materials, and color filters to create full-color effects. Because typical liquid crystals do not produce light, they are most often used in conjunction with a lighting source and other display elements to produce the desired visible output. For a number of reasons (low cost, long lifetime, reliability), light emitting diodes are frequently used as the light source in such displays. In turn, LEDs that produce white light are particularly useful for such purposes.

In physically small or low power display applications such as cell phones, one design places the white LEDs diodes along the edge or perimeter of the other display elements. When the LEDs are placed in this position, they provide output that is substantially parallel to the display rather than perpendicular to it. Accordingly, diodes that are packaged in a manner that directs their output laterally with respect to a defined plane (usually a circuit board or a display element), are referred to as side-view surface mount diodes or "sidelookers."

In general, light emitting diodes produce white light using two different approaches. In one approach, multiple LEDs of complimentary hues (e.g., red, green, and blue) are combined to produce white light. In another approach, a light emitting diode that emits in a higher energy portion of the visible spectrum (i.e., blue, violet, or ultraviolet) is used in conjunction with a phosphor that emits in a lower energy region of the visible spectrum; e.g. yellow when excited by the higher energy photons. When properly selected, the combination of the radiation emitted by the diode, and the yellow radiation emitted by the phosphor, produce white light.

The red-green-blue diode approach can offer the advantage of truer color in some circumstances, but typically requires active feedback and control of each LED hue. Alternatively, the single diode with phosphor approach is somewhat simpler in terms of physical construction and circuitry because it requires only the single (usually blue) LED and one or more phosphors, typically carried by an encapsulant adjacent to the diode chip.

For a number of these display applications, visibility represents a primary goal. Thus, obtaining as much light output as possible from any given source remains a fixed goal. In sidelooker LEDs, however, end users, and sometimes intermediate manufacturers, can experience less visible output then the capability of the underlying diode would indicate. In this regard, the output of the semiconductor diode itself (which will be referred to herein as the "chip") is often expressed in terms of power; e.g. milliwatts (mW). Because the end use of the diode, however, is a display, its output when packaged and in use is typically measured and expressed in terms of luminous intensity. Luminous intensity is measured in terms of candela (lumens per steradian). Because the candela is defined as the magnitude of an electromagnetic field from a monochromatic light source at 555 nanometers (nm) in a specified direction that has the intensity of 1.46 milliwatts per steradian, the theoretically perfect luminous output of a diode can be calculated from its power output.

In actual practice, however, a number of factors (some of which are unavoidable) reduce the efficiency from the theoretical to a less significant actual output. As one factor, the p-n junctions that produce light in most LEDs have no inherent directional output. Instead, the photons are emitted in all directions from the junction. Thus, some will be absorbed or internally reflected as they move in these different directions.

Other Factors that can reduce the output include the amount and composition of the phosphor, its placement, the composition and geometry of encapsulant, and the geometry of the package.

Accordingly, producing brighter displays requires an increase in the output efficiency of side-view surface mount white light emitting diodes.

SUMMARY

In one aspect the invention is a light emitting diode. The diode includes a package support, a semiconductor chip on the package support, with the chip including an active region that emits light in the visible portion of the spectrum. Metal contacts are in electrical communication with the chip on the package. A substantially transparent encapsulant covers the chip in the reflective package. A phosphor in the encapsulant emits radiation in the visible spectrum different from the radiation emitted by the chip and in response to the radiation emitted by the chip.

In another aspect, the invention is a display element that combines the light emitting diode and a planar display element. The combination includes a substantially planar display element with the light emitting diode positioned on the perimeter of the display element and with the package support directing the output of the diode substantially parallel to the plane of the display element.

The foregoing and other objects and advantages of the invention and the manner in which the same are accomplished will become clearer based on the followed detailed description taken in conjunction with the accompanying drawings.

DETAILED DESCRIPTION

Figure 1:
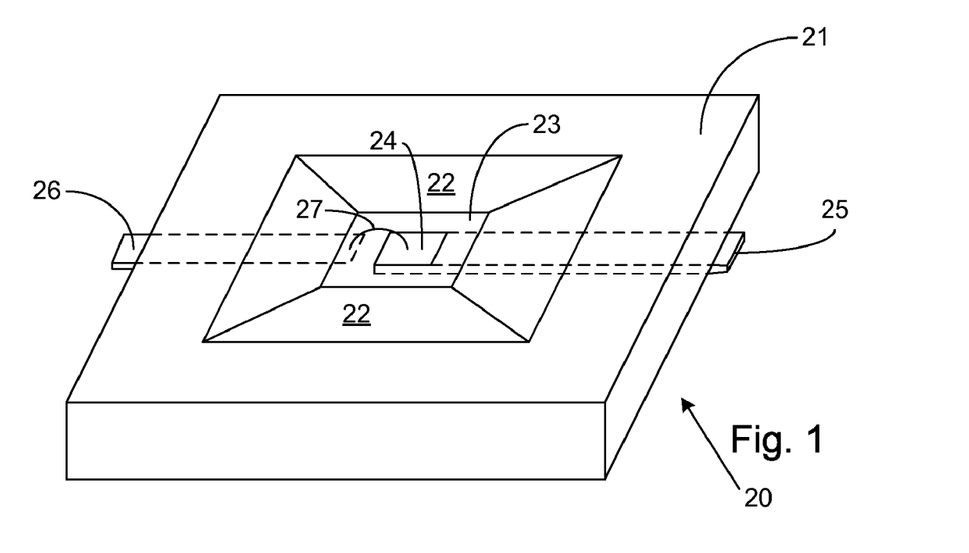
FIG. 1 is a schematic diagram in perspective view showing a partially packaged chip.
Figure 2:
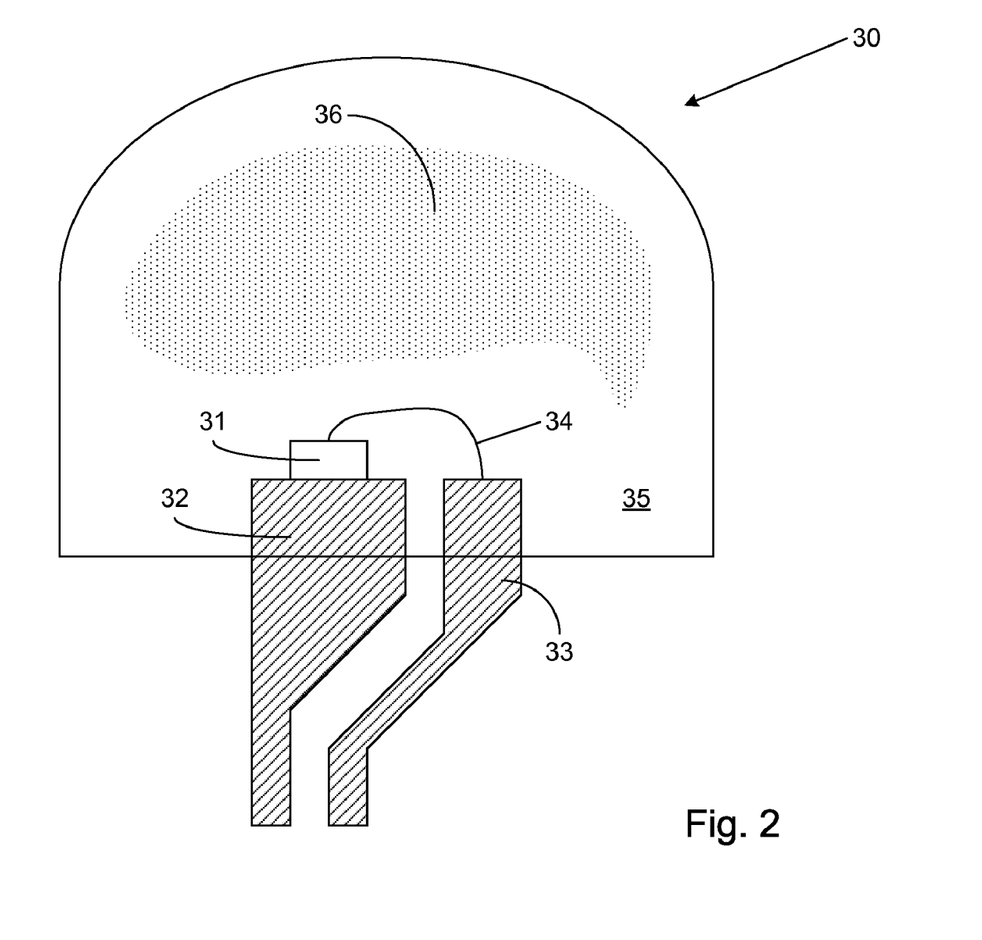
FIG. 2 is a schematic diagram illustrating a conventional packaged LED chip including a phosphor.

FIGS. 1 and 2 illustrate general aspects of LED structures that form an appropriate background for further discussion with respect to the invention. In its broadest context, the invention is a light emitting diode that comprises a package support, and a semiconductor chip on the package support. In exemplary embodiments, the package support is reflective (or includes reflective elements) to enhance the light output. The chip includes an active region (layers, p-n junction) that emits light in the visible or UV portions of the spectrum, metal contacts in electrical communication with the chip on the reflective package, a substantially transparent encapsulant covering the chip in the reflective package, and a phosphor in the encapsulant that emits radiation in the visible spectrum of longer wavelengths (lower energy) than that emitted by the chip and in response to the wavelength emitted by the chip. The chip is oriented in a side view orientation and the combination of the wavelengths emitted by the chip and the wavelengths emitted by the phosphor produces white light within the appropriate boundaries on the chromaticity diagram.

With that as context, FIG. 1 shows a partially packaged diode chip broadly designated at 20. Because the terms "light emitting diode" or "LED" are often used for the entire packaged device, the term "chip" will be used herein to designate the semiconductor portion of the device. FIG. 1 illustrates the reflective package support 21 the nature and structure of which will be described in more detail with respect to FIG. 7 and following. FIG. 1 will be understood to be schematic in nature and thus the shapes and sizes are illustrated for clarity rather than as an exact representation of particular devices.

As illustrated in FIG. 1, the reflective package 21 includes four downwardly sloping (or in some cases vertical) walls 22 that define a reflective recess and a floor 23. A semiconductor chip 24 rests on the floor 23 and thus on the reflective package 21. Although the chip 24 is shown schematically as the rectangle 24, it will be understood that it includes an active region, typically including a number of epitaxial layers and a p-n junction that emits light in the visible or UV portion of the spectrum. A pair of metal contacts 25 and 26 is in electrical communication with the chip 24 on the reflective package 21. The exact relationships will be described in more detail with respect to FIG. 7 and following, but typically a conductive portion of the chip 24 is in electrical contact with one of the metal contacts (25 in FIG. 1) while a wire 27 connects the chip 24 to the other contact 26. Again although the contacts 25 and 26 are schematically illustrated as rectangular solids, it will be understood that their purpose is to fit into an appropriate circuit board complementary device and thus they will be shaped as necessary.

FIG. 2 is a schematic diagram showing another arrangement for a packaged light emitting diode broadly designated at 30. In FIG. 2, the semiconductor chip 31 rests directly upon a metal lead frame element 32. A complementary metal contact 33 forms part of the overall package 30 and is in electrical communication with the chip 31 through the wire 34.

FIG. 2 also illustrates a substantially transparent encapsulant covering the chip 31 on the lead frame 32 in the package 30. Although the encapsulant is not illustrated in FIG. 1, if described schematically it would partially or totally fill the recess in the reflective package 21 that is defined by the sloping walls 22 and the floor 23.

FIG. 2 illustrates the phosphor broadly designated at 36 included in the encapsulant 35. The phosphor 36 emits radiation in the visible spectrum having lower energy than the radiation emitted by the chip 31 and does so in response to the wavelength emitted by the chip 31.

With FIGS. 1 and 2 as background context, additional features of the invention will be understood with respect to the remaining drawings.

It has been discovered in accordance with the present invention that the nature of the phosphor can improve the output efficiency of side-view surface mount diodes of the type described herein. Most phosphors are solid materials that are produced by chemical reactions including precipitation and calcinations. As they are handled and stored, the individual physical particles of phosphor can become agglomerated. In general, a non-agglomerated phosphor will tend to perform better than an agglomerated one. Furthermore, because of the better performance of non-agglomerated particles, particle size can be reduced by milling the phosphor. Nevertheless, the milling process degrades the optical performance of the phosphor by introducing surface defects that in turn can produce non-radiative pathways that in turn reduce the optical response of the phosphor.

Figure 3:
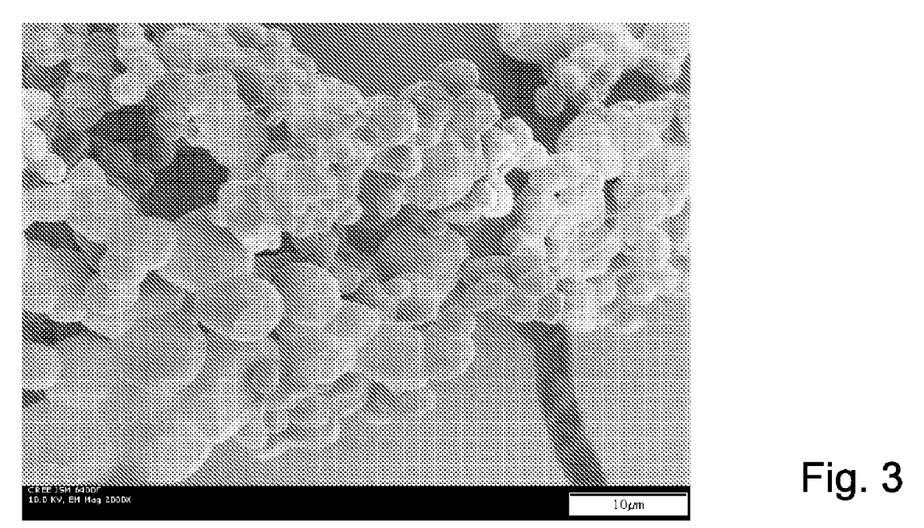
FIGS. 3, 4 and 5 are photographs of phosphor particles as used in applications according to the present invention.
Figure 4:
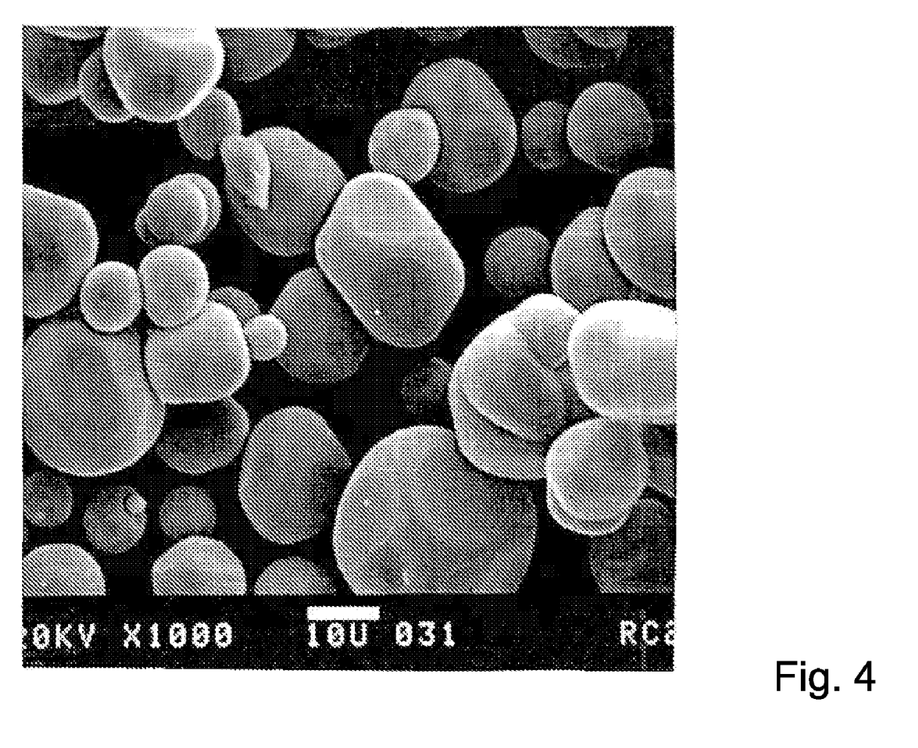
Figure 5:
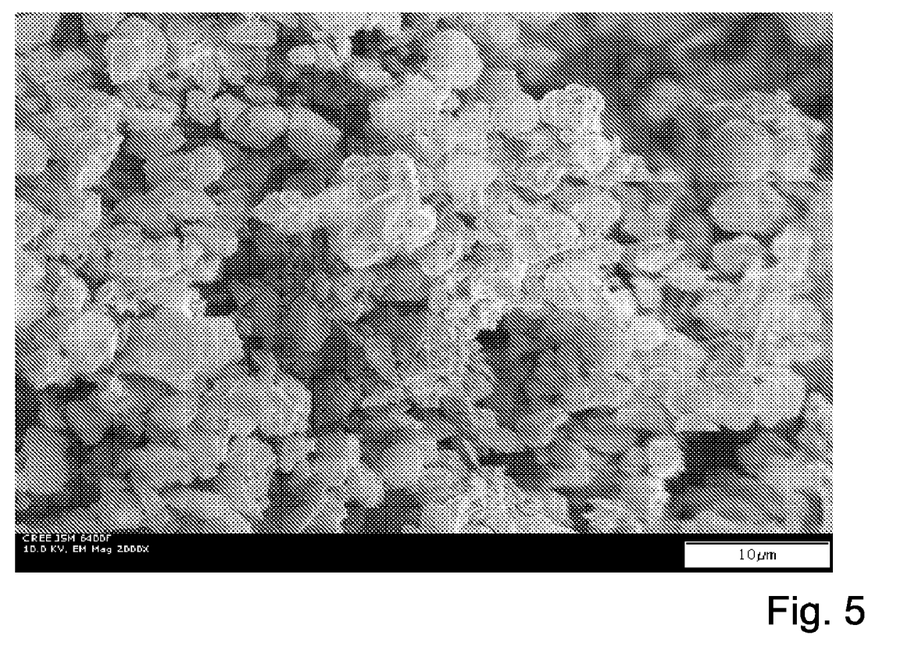

For illustration, FIG. 3 herein is a photograph showing an agglomerated phosphor, FIG. 4 is a photograph of a non-agglomerated phosphor, and FIG. 5 is a photograph of a phosphor that has been milled. Suitable phosphors that complement blue radiation (i.e., from the chip) include YAG:Ce (ccx=0.44, ccy=0.54) and its derivatives, $(Sr,Ba)_2SiO_4$:Eu (0.43, 0.53), $CaGa_2S_4$:Eu, green-emitting $SrGa_2S_4$:Eu (ccx=0.27, ccy=0.68), and red-emitting (Sr,Ca)S:Eu (ccx=0.65, ccy=0.33), with the relevant emission coordinates referring to the chromaticity (CIE) diagram.

Preferably the phosphor particle size, based on the diameter across the largest dimension of a given particle, should be greater than about one micron (1 μm) and preferably greater than about 2 μm to maximize efficiency. Smaller particles tend to avoid settling or distributing properly in the encapsulant and thus tend to introduce color non-uniformity. Particles that are too large will, of course, become physical barriers to light in spite of any phosphorescent benefit and will degrade performance as a result. Accordingly, and although the upper limit need not be exact, phosphor particles in a size range of between about 2 and 25 microns are preferred.

It is expected that coating the particles of the phosphor will improve their handling and dispersing properties. It is expected that inorganic coatings of nanometer size (i.e., less than about 15 nanometers) particles of, for example, silicon dioxide ($SiO_2$), attached to the phosphor surface in an amount of less than about one percent (1%) by weight will work well. Examples include the SNOWTEX line of colloidal silica from Nissan Chemical America Corporation, Houston, Tex., USA. The coating should, of course, be transparent to both the excitation frequency from the chip and the emission frequency from the phosphor.

In preferred embodiments, the semiconductor chips according to the invention are formed from wide bandgap semiconductor materials such as silicon carbide (SiC) or the Group III nitrides. Examples include chips from Cree, Inc., Durham, N.C., USA, the assignee herein. See, *Cree Products*, [online] http://www.cree.com/products/index.htm (April 2006). Because of their wide bandgap capabilities, these chips tend to emit in the blue portion of the visible spectrum. Thus, phosphors that emit in the yellow portion of the spectrum are an ideal complement to the blue-emitting diode chips. Exemplary chips can emit at wavelengths as short as 380 nm (i.e., in the UV) and can include chips that operate at forward voltages of 3 volts (V) or less (at 20 milliamps (mA) current). The chips can include roughened or lenticular surfaces or substrates to enhance light extraction.

Combinations of phosphors can be used in conjunction with the blue or UV-emitting chip to create white light; e.g. blue and yellow, blue and green and red, and blue and green and yellow and red. Using three or more colors provides the opportunity to select a particular white point and a better color rendering. It is also expected that LEDs with more than one emission peak will be useful in exciting one or more phosphors to produce white light.

Figure 6:
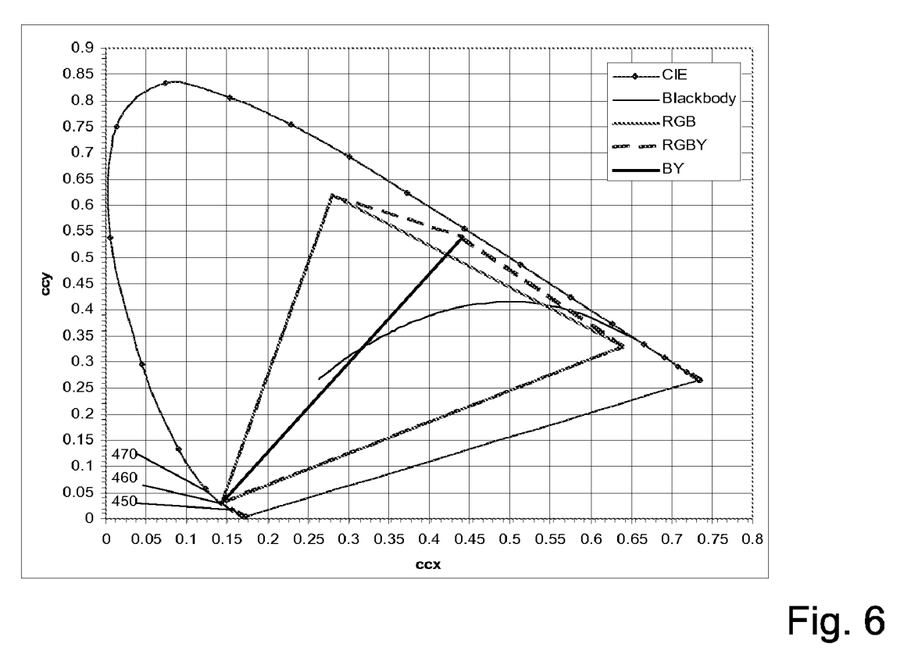
FIG. 6 is the chromaticity diagram and showing the output of various basic devices.

As used herein, and generally in this art, the term "white" is used to describe the output of a device that produces two or more emissions that, when combined, appear as a shade of white to the human eye. In particular, illumination devices are sometimes categorized by their "correlated color temperature" (CCT) which compares the color of a particular device to a reference source heated to a particular temperature. The devices according to the invention have CCT's of at least 4500K to 8000K and in some cases 2700K to 10,000K As another method of describing "white" light, FIG. 6 represents the well understood chromaticity (or "CIE") chart. Those familiar with the chart and the nature of colors will understand that when two color sources are available, the only possible color combinations they can produce will fall along a single line between those colors on the CIE chart. By adding third or fourth colors, the available color points fall within a polygon defined by the points of each selected color. Thus, when two phosphors with two different emissions are used in conjunction with the chip and its third color emission, the color emitted by the diode can be designed to fall at a certain position—i.e. a certain color, including white—within the chart. The positions within the CIE chart that represent white light are generally well-understood in this art.

FIGS. 7 through 13 illustrate various possible relationships among and between the chip, the reflective package, the encapsulant, the phosphor, potentially a diffuser, and the contacts.

Figure 7:
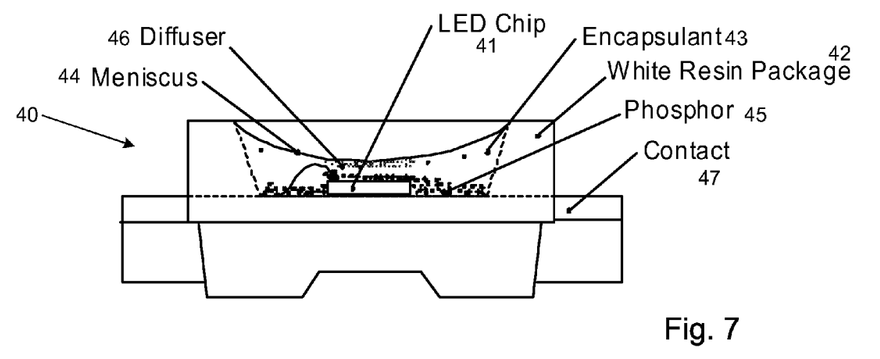
FIGS. 7 through 13 are schematic cross-sectional illustrations of packaged diodes according to the present invention.

FIG. 7 illustrates an LED broadly designated at 40 in which the semiconductor chip 41 is located on the floor of the reflective package 42 which is typically formed of a white resin such as a polyphthalamide (e.g. AMODEL from Solvay Advanced Polymers, L.L.C., Alpharetta, Ga. USA) or a heat-resistant polyamide resin (e.g. GENESTAR from Kuraray Co., Ltd, Tokyo, Japan). The encapsulant 43 partially fills the depression (FIG. 1) in the resin package 42 and forms a meniscus 44 with respect to the other geometry of the diode 40.

In FIG. 7, the phosphor 45 is settled (defined herein as more than 50 percent of the phosphor in the lower 25 percent of the encapsulant 43). A diffuser 46 can be included in the encapsulant to enhance the light output. As used herein, the diffuser is any solid particle that helps scatter light more efficiently within the encapsulant and thus enhance the overall output. The diffuser is typically a ceramic, and can be selected or tailored with respect to the chip, the package geometry, and the phosphor.

For example, silicon dioxide particles used as the diffuser provide an index of refraction that is nearer in value to the typical encapsulant and thus acts as a "weaker" diffuser. This results in low loss. $SiO_2$ is also easily and widely available.

Silicon carbide (SiC) can be used as a diffuser, also with relatively low loss, but its high index of refraction makes it a strong diffuser, which is favored in some circumstances. Silicon carbide is, however, generally harder to work with in small particle sizes than is silicon dioxide.

Other ceramics such as titanium dioxide ($TiO_2$) are readily available and can be incorporated as desired. In addition to ceramics, or in addition to dispersing these in the encapsulant, the diffuser can actually be pre-formed in a separate piece and then positioned where desired. As illustrated in FIG. 7, the diffuser 46 can be placed over the chip 41 and the phosphor 45 and is typically suspended in the encapsulant layer.

FIG. 7 also illustrates the contacts 47 in conjunction with the resin package 42.

Figure 8:
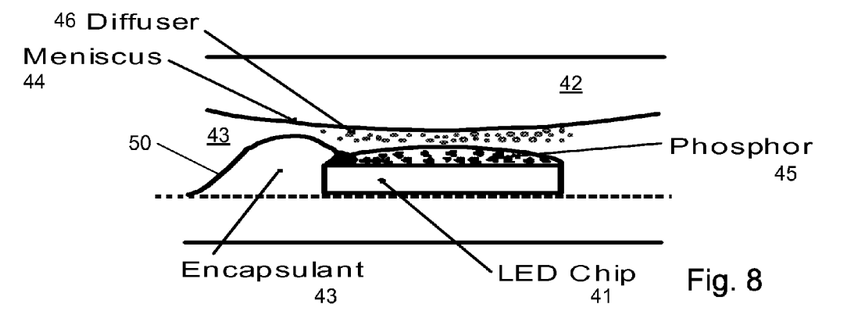

FIG. 8 is an enlarged view of the chip 41 and some of the surrounding elements. In FIG. 8 the phosphor 45 is concentrated directly on the chip 46 in an orientation that is sometimes referred to as "globbed." The diffuser 46 is positioned in the encapsulant 43 between the meniscus 44 and the phosphor 45. Portions of the package 42 form the background of FIG. 8. A wire 50 connects at least one electrode of the chip 46 to one of the contacts (not shown in FIG. 8).

Figure 9:
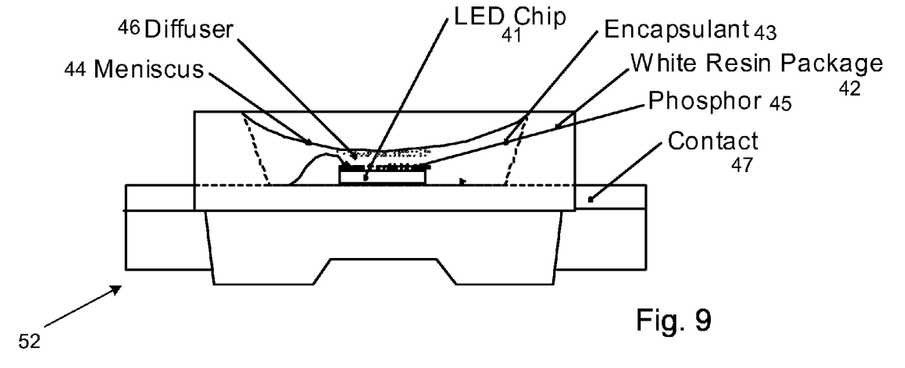

FIG. 9 illustrates an embodiment broadly designated at 52 (with common elements otherwise numbered the same as in FIGS. 7 and 8) in which the phosphor 45 has been placed on the chip 41 by means of a deposition procedure for example electrophoretic deposition. Such deposition provides an extremely uniform manner of positioning the phosphor with respect to the chip 41 the encapsulant 43 and a package 42.

Figure 10:
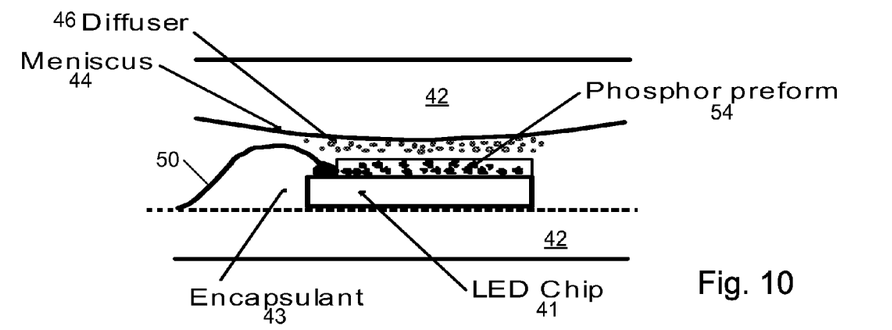

FIG. 10 shows an embodiment in enlarged fashion in which the phosphor is included in a pre-form 54 that is positioned directly over the chip 41 as a component of another piece-part. The other elements of FIG. 10 are otherwise the same as FIGS. 7-9.

Figure 11:
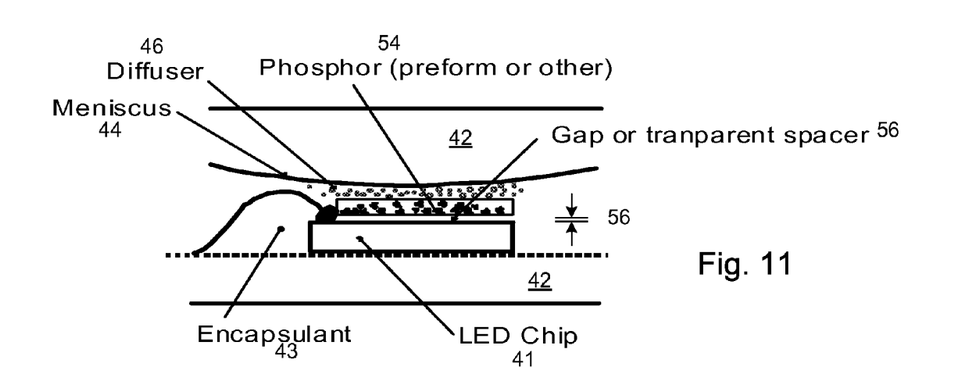

FIG. 11 illustrates an arrangement similar to FIG. 10 but with a specified gap 56 or a physical spacer element between the chip 46 and the phosphor. The presence of the gap provides the opportunity for light to escape the chip 41 before striking the phosphor 54 pre-form and thus prevents the closely adjacent phosphor from physically blocking the light before it has a chance to convert to the lower frequency.

In yet other embodiments (not shown), the diffuser 46 can be placed more closely adjacent to the chip 41 than is the phosphor, thus diffusing the light before the light strikes the phosphor.

In exemplary embodiments the encapsulant is formed of either single or multiple compositions, which are selected for their physical, optical, and chemical properties. Exemplary compositions for the encapsulant include silicone, epoxy resins, elastomers, certain gels, thermoplastic resins, and acrylic resins. In general, the encapsulant should be transparent within the relevant frequencies, and should resist or be inert to chemical reaction with the materials in the chip, the package, the phosphor, or the diffuser. To the extent possible the encapsulant should resist photochemistry reactions, and should provide the desired environmental protection and necessary physical strength. Each of these particular factors may be more important in particular situations, and thus the best choice change depending upon the specific application.

The encapsulant's refractive index ($I_R$) should typically range from between about 1.4 and about 1.6. Encapsulants can be further characterized as those with refractive indexes that are somewhat higher (1.5-1.6) or lower (1.4-1.5) within this range. High refractive index encapsulants have advantages but may not transmit as well as lower refractive index materials. Additionally, materials within the refractive index range of 1.4-1.5 tend to be more widely available.

The encapsulant's transparency should permit more than 95 percent transmission of wavelengths between about 460 and 550 nanometers with less than one decibel per centimeter loss.

From a physical standpoint, encapsulant resins should have a Shore D hardness of between about 20 and 100, elastomers should be between about 10 and 95 on the Shore A scale, and gels should be between about 10 and 50 on a Shore 00 scale.

Depending upon the nature of the desired or necessary fabrication, the curing temperature of the encapsulant material may be taken into account for advantageous purposes.

In a number of embodiments such as those illustrated in FIGS. 7, 8, 9, 10, 11 and 13, the encapsulant has a negative meniscus 44. The depth of the meniscus, defined as the distance between the package wall and the meniscus, can be selected for various purposes and typically ranges from 0 (planar meniscus) to 500 microns. A meniscus depth between about 320 and 280 microns provides a narrower viewing angle (90-110°) and higher color uniformity. A depth between about 260 microns provides color uniformity at a wider viewing angle (110-120°).

Figure 12:
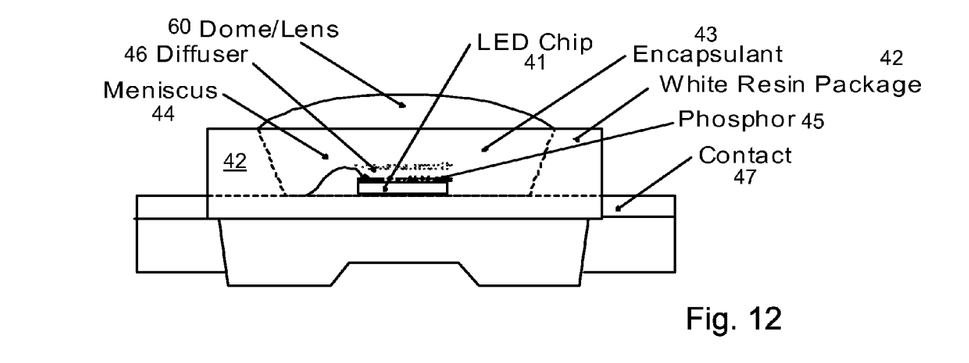

If desired, and as illustrated in FIG. 12, the encapsulant 43 can form a dome (lens) 60. In exemplary embodiments the dome can have a height above the top of the package 42 of between about 60 and 400 microns. Depending upon the size and shape of the meniscus 44 or the dome 60, a near-Lambertian far-field pattern can be produced. Certain shapes can help maximize light extraction, but may do so at a cost (i.e., a trade off) of some color uniformity. If desired, however, the placement of the phosphor and the diffuser can be adjusted to obtain a desired result.

As noted earlier, the chip (41 in most of the drawings) preferably emits a relatively high energy frequency which serves two functions. First, the phosphor will convert a higher energy (shorter wavelength) photon into a lower energy (longer wavelength) photon of a second color. Second, the combination of higher frequency photons that are not converted with the lower frequency photons from the phosphor can produce white light. Accordingly, the chip is preferably formed from a wide bandgap material, which in exemplary embodiments is one of the Group III nitrides. The availability of these chips on either vertically conducting substrates (e.g. silicon carbide) or with the substrate removed, permits advantageous geometry in the overall package. When used with the conducting substrate, the chip can be limited to a single top side contact thus making multiple top side contacts optional rather than necessary.

The chip can also be bump bonded without top contacts.

The chip preferably has an aspect ratio that matches the size of the desired package in efficient fashion. Thus, the chip profile can be square, or have a rectangular aspect ratio of (and between) 1.2, 1.5, 2.0, or even greater.

Preferably, the chip has a radiant flux greater than 30 milliwatts although in some cases, for some applications, lower radiant flux chips are acceptable.

As noted above, in order to get the desired color, the dominant wavelength from the chip should be between about 430 and 470 nanometers with the peak wavelength between about 380 and 470 nanometers. As recognized by those in the art, the term dominant wavelength has less meaning below about 430 nanometers.

As further mentioned in the background, the package can incorporate three chips to form a three-color pixel that produces the white light. A three-color pixel offers the advantage of requiring neither filters nor phosphors to produce white light. Such a pixel will, however, require additional leads and circuitry.

The chip thickness can be an important design parameter. It will be understood, however, that thickness is relative and that some applications are better served by relatively thicker chips while others are better served by relatively thinner chips. If transparent, thicker chips tend to help with white uniformity while thinner chips tend to result in increased brightness.

Generally, the epitaxial film portion of the chip will be relatively small, typically on the order of about 2 μm. Overall, however, the chip size will typically range from between about 25 μm up to 250 μm. A 25 μm chip offers brightness advantages, but its small size makes it more difficult to handle. Thicker chips can be handled more easily, and as noted above can improve the uniformity of the light extraction. In cases where the substrate is not transparent, however, additional thickness offers no optical advantage.

The schematic illustrations tend to show the chip in an aligned fashion with respect to the geometry of the package; e.g., the orientation illustrated in FIG. 1. The chip can, however, be oriented differently (typically rotated in a plane) to extract light more efficiently. Such orientations can improve color uniformity by specifically avoiding matching the long axis of a rectangular chip with the long axis of a rectangular package.

Although not specifically illustrated in the drawings as a separate element, those familiar with diodes of this type recognized that the chip (e.g. 41 in FIGS. 7-13) is fixed to the package 42 in some manner. In some cases, the chip is conductively attached with a material such as silver epoxy or a eutectic metal. Other conductive attachments include conductive tapes and conductive thermoplastic (i.e., a plastic with a second component dispersed therein to create the conductive pathways). Such conductive adhesives are necessary or advantageous in some embodiments, but can provide an additional possibility for light loss. For example, silver epoxy tends to be opaque in use. Thus, its conductive advantages in use will be balanced against potential light loss.

For designs that do not require a direct conductive attachment between the chip and the package, the attachment can be carried out using nonconductive materials. These can include the same (or a related) material as the encapsulant, or a tape (a number of cell phone components are typically attached in this matter) or one of the resins referred to earlier including thermoplastics, epoxies, silicone and acrylics.

Figure 13:
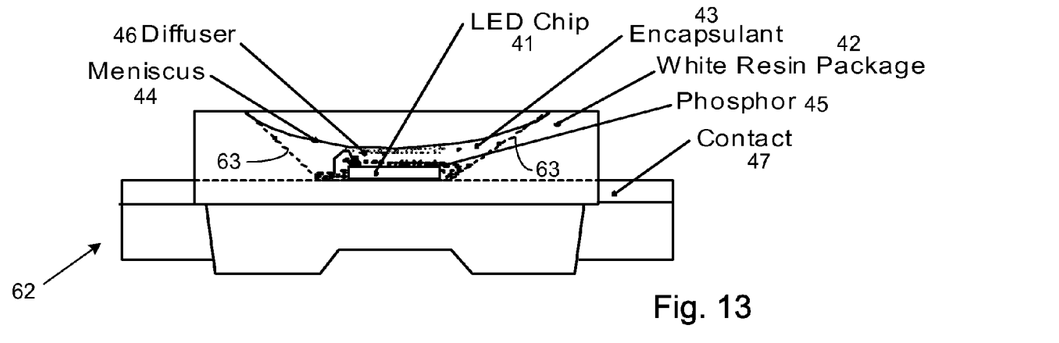
Figure 14:
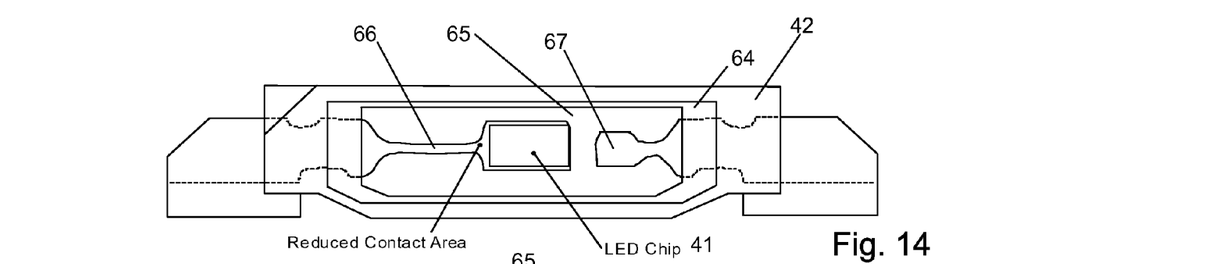
FIGS. 14 through 16 are side elevational views of diodes according to the present invention.
Figure 15:
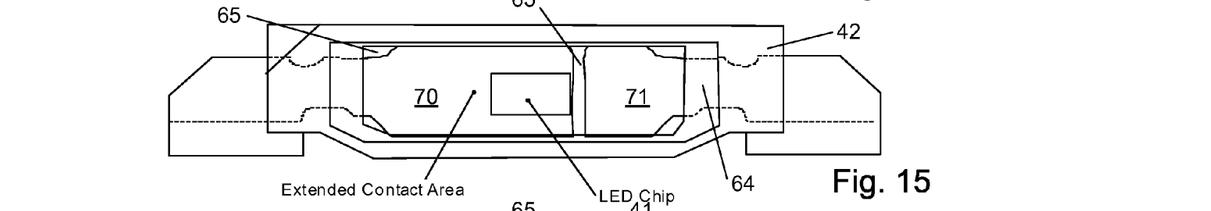
Figure 16:
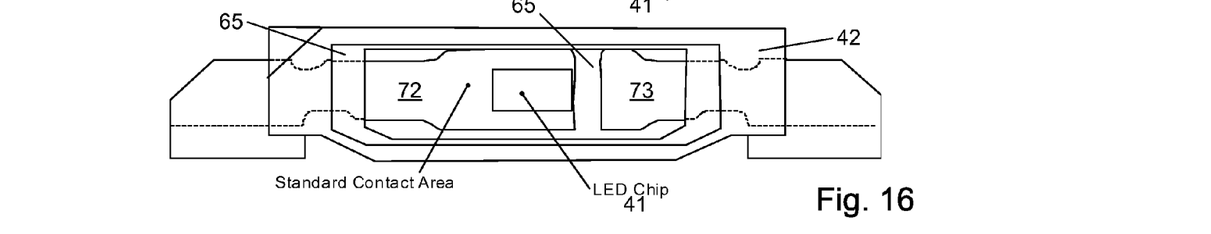

Other aspects of the invention are illustrated in FIGS. 13 through 16. FIG. 13 illustrates a packaged chip broadly designated at 62 in which the sloped sidewalls 63 are placed at an angle that produces a floor that relatively closely matches the size of the chip 41 and thus reduces the contact area. Generally speaking, if the package material 42 is more reflective than the contact metal 47, then minimizing the contact area produces greater light extraction In turn, FIGS. 14, 15 and 16 illustrate how the contact area can be modified depending upon its optical properties. FIGS. 14-16 are side elevational views of a sidelooker diode according to the invention and in which the desired direction of light production is outwardly from the page towards the reader.

These illustrations all include the chip 41 and the resin package 42. In a manner consistent with FIG. 1, the resin package 42 includes a plurality of sloping walls 64 which in FIGS. 14-16 define an irregular six-sided polygon which in turn defines the floor 65 with a similar (but smaller) shape.

FIG. 14 illustrates the embodiment in which the package material 42 is more reflective than the metal contact illustrated at 66 and 67. Accordingly, in FIG. 14 the contact area is minimized with respect to the floor 65 of the package 42.

FIG. 15 illustrates an embodiment in which the contact material 70, 71 is more highly reflective than the package material 42. In such cases, increasing the area of the contacts 70, 71 with respect to the package floor 65 increases the brightness of the resulting device.

FIG. 16 illustrates an embodiment in which the reflective characteristics of the package 42 and the contacts 72, 73 are more similar and thus the relative size of each is less important.

Figure 17:
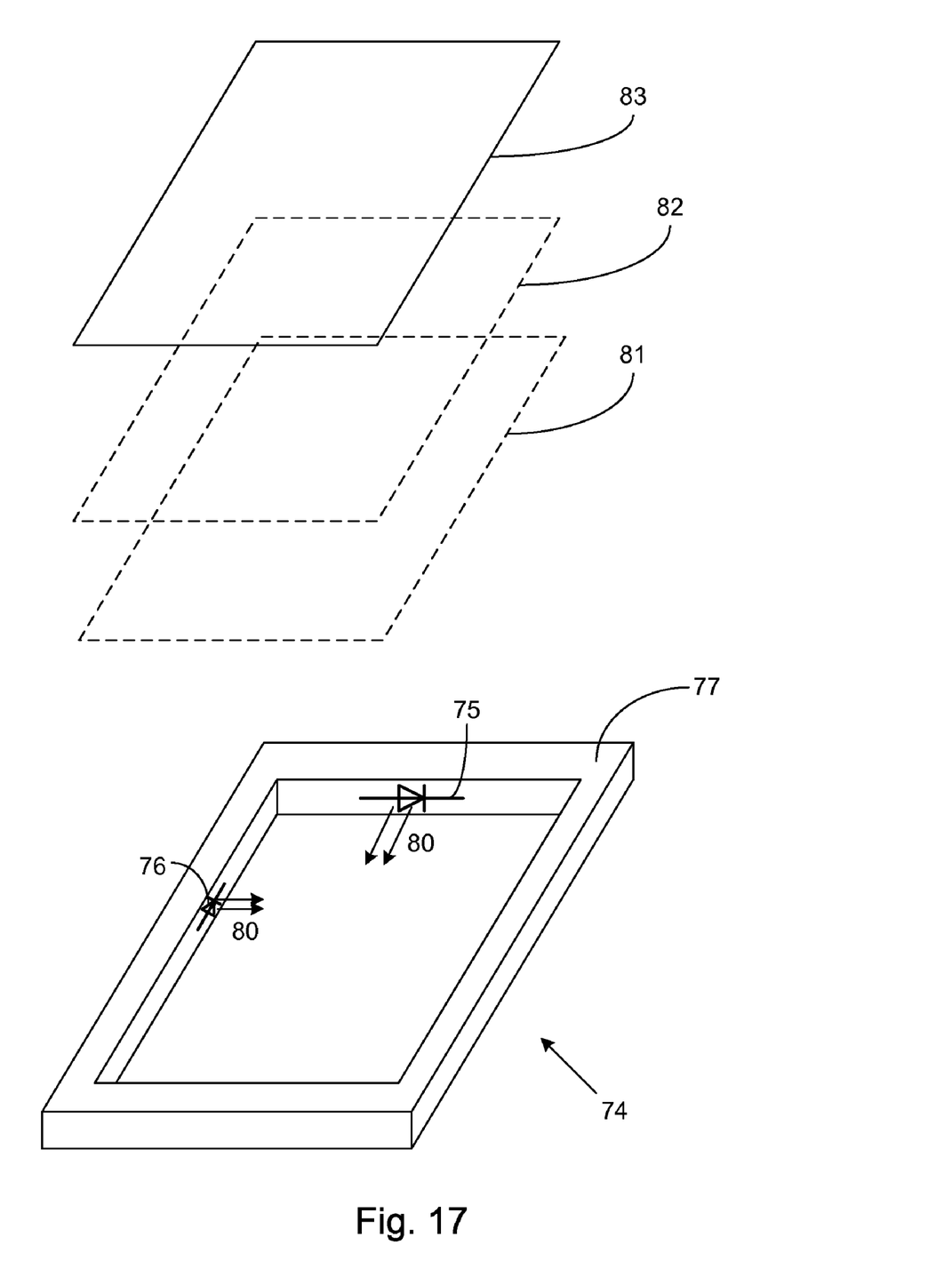
FIG. 17 is a schematic perspective view of a display element according to the present invention.

FIG. 17 is a schematic diagram of a diode according to the present invention in the context of the display element. The display element is broadly designated at 74 and is substantially planar. As noted earlier, the end use of the display 74 can fall within a number of applications with cellular phones, personal digital assistants, and portable gaming devices being currently well recognized categories. Each of these contains a number of design and functional elements that, for the sake of clarity, are not reproduced in FIG. 17. These displays are well understood by persons of ordinary skill in the art, however, and thus the invention can be incorporated into such applications without undue experimentation.

FIG. 17 accordingly illustrates two diodes 75 and 76 positioned on the perimeter 77 of the display element 74, and with the arrows 80 illustrating that the diodes direct light in a primary direction that is parallel to the plane of the display element 74. The display element 74 can also include additional elements illustrated schematically such as a liquid crystal display 81, one or more color filters 82, and potentially a polarizing film 83.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A light emitting diode comprising:
   a package support;
   a semiconductor chip on said package support, said chip including an active region that emits radiation in the visible or UV portion of the spectrum;
   metal contacts in electrical communication with said chip on said package; a substantially transparent encapsulant covering said chip in said package;
   a phosphor in said encapsulant that emits radiation in the visible spectrum different from the radiation emitted by said chip and in response to the wavelength emitted by said chip; and
   a diffuser distributed in a pre-form and with said pre-form positioned within said encapsulant adjacent said diode.

2. A light emitting diode according to claim 1 comprising a diode and a phosphor with combined output radiation that produce white light.

3. A light emitting diode according to claim 2 wherein said diode emits in the blue portion of the visible spectrum.

4. A light emitting diode according to claim 2 wherein said phosphor is selected from the group consisting of: YAG:Ce, $(Sr,Ba)_2SiO_4$:Eu, $CaGa_2S_4$:Eu, $SrGa_2S_4$:Eu, and $(Sr,Ca)S$:Eu, and combinations thereof.

5. A light emitting diode according to claim 1 wherein said phosphor is dispersed within said encapsulant.

6. A light emitting diode according to claim 1 wherein said phosphor is packaged in a pre-form and positioned within said encapsulant.

7. A light emitting diode according to claim 1 further comprising a diffuser dispersed within said encapsulant.

8. A light emitting diode according to claim 1 wherein said encapsulant defines a meniscus with respect to said package and said chip.

9. A display element comprising the combination of a light emitting diode and a planar display element, the combination comprising:
   a substantially planar display element;
   a light emitting diode positioned on the perimeter of said display element and including;
   a reflective package support that directs the output of said diode substantially parallel to the plane of said display element;
   a semiconductor chip on said reflective package support, said chip including an active region that emits radiation in the visible or UV portion of the spectrum;
   metal contacts in electrical communication with said chip on said reflective package;
   a substantially transparent encapsulant covering said chip in said reflective package, said encapsulant forming a negative meniscus; and;
   a phosphor in said encapsulant that emits radiation in the visible spectrum different from the radiation emitted by said chip and in response to the wavelength emitted by said chip.

10. display element according to claim 9 comprising a diode and a phosphor with combined output frequencies that produce white light.

11. A display element according to claim 9 comprising a liquid crystal display.

12. A display element according to claim 9 comprising a color filter.

13. A display element according to claim 9 comprising a polarizer.

14. A display element according to claim 9 comprising a plurality of phosphors in said encapsulant that emit radiation at different wavelengths from one another.

15. A light emitting diode comprising:
   a package support;
   a semiconductor chip on said package support, said chip including an active region that emits radiation in the visible or UV portion of the spectrum;
   metal contacts in electrical communication with said chip on said package; a substantially transparent encapsulant covering said chip in said package; and
   a phosphor in said encapsulant that emits radiation in the visible spectrum different from the radiation emitted by said chip and in response to the wavelength emitted by said chip, with more than 50 percent of the phosphor positioned in the lower 25 percent of the encapsulant.

16. A light emitting diode according to claim 15 wherein said diode emits in the blue portion of the visible spectrum and the combined output radiation of said diode and said phosphor produces white light.

17. The combination of:
   a planar display element; and
   a light emitting diode according to claim 15 positioned as a side view surface mount diode on the perimeter of said display element to transmit its radiation beam parallel to the plane of said display element.

18. A light emitting diode comprising:
   a package support;
   a semiconductor chip on said package support, said chip including an active region that emits radiation in the visible or UV portion of the spectrum;
   metal contacts in electrical communication with said chip on said package;
   a substantially transparent encapsulant covering said chip in said package;
   a phosphor in said encapsulant that emits radiation in the visible spectrum different from the radiation emitted by said chip and in response to the wavelength emitted by said chip; and
   a physical spacer element between said chip and said phosphor.

19. A light emitting diode according to claim 18 wherein said diode emits in the blue portion of the visible spectrum and the combined output radiation of said diode and said phosphor produces white light.

20. The combination of:
  a planar display element; and
  a light emitting diode according to claim 18 positioned as a side view surface mount diode on the perimeter of said display element to transmit its radiation beam parallel to the plane of said display element.

* * * * *